(12) United States Patent
Mulfinger et al.

(10) Patent No.: US 8,328,571 B2
(45) Date of Patent: Dec. 11, 2012

(54) CONNECTOR ASSEMBLIES HAVING MOVEABLE MATING ARRAYS AND POWER CONNECTORS

(75) Inventors: Robert Neil Mulfinger, York Haven, PA (US); Richard Elof Hamner, Hummelstown, PA (US); Jason M'Cheyne Reisinger, Carlisle, PA (US); Michael T. Sykes, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 44 days.

(21) Appl. No.: 12/939,797

(22) Filed: Nov. 4, 2010

(65) Prior Publication Data

US 2012/0115345 A1    May 10, 2012

(51) Int. Cl.
H01R 13/15    (2006.01)
(52) U.S. Cl. .......................................... 439/260; 439/65
(58) Field of Classification Search .................. 439/260, 439/267, 259, 67
See application file for complete search history.

(56) References Cited

U.S. PATENT DOCUMENTS

| | | |
|---|---|---|
| 4,518,210 A | 5/1985 | Morrison |
| 4,603,928 A | 8/1986 | Evans |
| 4,626,056 A | 12/1986 | Andrews, Jr. et al. |
| 4,629,270 A | 12/1986 | Andrew, Jr. et al. |
| 4,840,569 A | 6/1989 | Cabourne |
| 5,092,781 A | 3/1992 | Casciotti et al. |
| 5,102,342 A | 4/1992 | Marian |
| 5,171,154 A | 12/1992 | Casciotti et al. |
| 5,228,863 A | 7/1993 | Campbell et al. |
| 5,772,451 A | 6/1998 | Dozier, II et al. |
| 6,062,872 A | 5/2000 | Strange et al. |
| 6,077,090 A | 6/2000 | Campbell et al. |
| 6,411,517 B1 | 6/2002 | Babin |
| 6,672,878 B2 | 1/2004 | Dean |
| 6,945,788 B2 | 9/2005 | Trout et al. |
| 6,981,886 B1 * | 1/2006 | Co et al. ........................ 439/160 |
| 7,044,746 B2 | 5/2006 | Copper et al. |
| 7,114,961 B2 | 10/2006 | Williams |
| 7,121,859 B2 * | 10/2006 | Van Schuylenbergh et al. ............................ 439/260 |
| 7,291,031 B2 * | 11/2007 | Crofoot et al. ................ 439/265 |
| 7,297,015 B1 | 11/2007 | Desrosiers et al. |
| 7,374,441 B2 | 5/2008 | Rubenstein |
| 7,419,400 B1 | 9/2008 | Taylor et al. |
| 7,425,134 B1 | 9/2008 | Taylor |
| 7,438,577 B2 * | 10/2008 | Bridges et al. ................ 439/260 |
| 7,438,582 B2 | 10/2008 | Taylor |
| 7,789,668 B1 * | 9/2010 | Hamner et al. ................. 439/65 |
| 7,815,451 B2 * | 10/2010 | Simon et al. .................. 439/260 |
| 2007/0097662 A1 | 5/2007 | Dean |
| 2008/0227314 A1 | 9/2008 | Taylor |

OTHER PUBLICATIONS

Neoconix PCBeam™ Interposer Design Guide, Neoconix, Rev. 070925, 4 pgs.

* cited by examiner

*Primary Examiner* — Hien Vu (57) ABSTRACT

A connector assembly that includes a base frame that extends along a longitudinal axis between a pair of frame ends. The connector assembly also includes a moveable mating side that is supported by the base frame and extends in a longitudinal direction along the longitudinal axis. The mating side has a mating array of terminals configured to communicate data signals. The connector assembly also includes a power connector that is configured to establish an electrical connection. The power connector is coupled to the mating side. Also, the connector assembly includes a coupling mechanism that is supported by the base frame and is operatively coupled to the mating side. The coupling mechanism is configured to be actuated to move the mating side between retracted and engaged positions in a mating direction with respect to the longitudinal axis.

22 Claims, 9 Drawing Sheets

CONNECTOR ASSEMBLIES HAVING MOVEABLE MATING ARRAYS AND POWER CONNECTORS

BACKGROUND OF THE INVENTION

The subject matter herein relates generally to connector assemblies, and more particularly, to connector assemblies that are configured to communicatively couple different components, such as circuit boards.

Some systems, such as servers, routers, and data storage systems, utilize connector assemblies for transmitting data signals and/or power through the system. Such systems typically include a backplane or a midplane circuit board, a motherboard, and a plurality of daughter cards. The connector assemblies may be attached to the circuit board(s) for interconnecting the daughter cards to the circuit board(s) when the daughter cards are inserted into the system. Each daughter card includes a connector assembly having a mating face that includes a plurality of contacts. Likewise, the backplane connector assembly may have a mating face with corresponding contacts. The daughter card connector assembly is typically positioned on or near a leading edge of the daughter card. Prior to being mated, the mating faces of the daughter card connector assembly and the backplane connector assembly are aligned with each other and face each other along a mating axis. The daughter card is then moved in an insertion direction along the mating axis until the contacts of the different mating faces engage each other.

Accordingly, conventional backplane (or midplane) connector assemblies interconnect daughter cards and backplane circuit boards by moving the daughter card in an insertion direction which is the same as the mating direction. In some cases, it may be desirable to mate the daughter card in a mating direction that is perpendicular to the insertion direction. However, when the receptacle assembly of the daughter card faces a direction that is perpendicular to the insertion direction (e.g., perpendicular to a surface of the daughter card) and the backplane connector assembly also faces a direction that is perpendicular to the insertion direction, it may be difficult to properly align and mate the corresponding contacts. The contacts may be used to transmit data signals or electrical power. In either case, it may be difficult to properly align the contacts of the daughter card and the backplane connector assembly.

Accordingly, there is a need for connector assemblies that facilitate interconnecting a printed circuit to another communication component to transmit data signals and/or power when the printed circuit and the communication component are oriented in an orthogonal relationship as described above. There is also a general need for alternative connector assemblies that are capable of interconnecting separate communication components having an orthogonal relationship.

BRIEF DESCRIPTION OF THE INVENTION

In one embodiment, a connector assembly is provided that includes a base frame that extends along a longitudinal axis between a pair of frame ends. The connector assembly also includes a moveable mating side that is supported by the base frame and extends in a longitudinal direction along the longitudinal axis. The mating side has a mating array of terminals configured to communicate data signals. The connector assembly also includes a power connector that is configured to establish an electrical connection. The power connector is coupled to the mating side. Also, the connector assembly includes a coupling mechanism that is supported by the base frame and is operatively coupled to the mating side. The coupling mechanism is configured to be actuated to move the mating side between retracted and engaged positions in a mating direction with respect to the longitudinal axis. The mating array and the power connector are spaced apart from a communication component in the retracted position and communicatively coupled to the communication component in the engaged position.

In another embodiment, a removable card assembly is provided and includes a connector frame that has leading and trailing ends and a longitudinal axis extending therebetween. The connector frame is configured to be removably coupled to an electrical system. The removable card assembly also includes a moveable mating side that is supported by the connector frame and extends in a longitudinal direction along the longitudinal axis. The mating side has a mating array of terminals configured to communicate data signals. The removable card assembly also includes a power connector that is configured to establish an electrical connection. The power connector is coupled to the mating side. Also, the removable card assembly includes a coupling mechanism that is supported by the connector frame and is operatively coupled to the mating side. The coupling mechanism is configured to be actuated to move the mating side between retracted and engaged positions in a mating direction with respect to the longitudinal axis. The mating array and the power connector are spaced apart from a communication component in the retracted position and communicatively coupled to the communication component in the engaged position.

DETAILED DESCRIPTION OF THE INVENTION

Embodiments described herein include connector assemblies that are configured to establish at least one of an electrical and optical connection to transmit data signals between different communication components. Connector assemblies described herein may also establish an electrical connection to transmit power between the communication components. Communication components that may be interconnected by such connector assemblies may be printed circuits (e.g., circuit boards or flex circuits), other connector assemblies (e.g., optical and/or electrical connector assemblies), or any other components that are capable of establishing an electrical or optical connection.

The connector assemblies can include one or more moveable mating arrays that have terminals configured to engage other terminals of the communication component to establish an electrical and/or optical connection. For example, the terminals may be mating contacts for establishing an electrical connection or the terminals may be optical fiber terminals for establishing an optical connection. Embodiments described herein may also include one or more moveable power connectors that have electrical contacts (also referred to as power contacts) configured to engage other power contacts to establish an electrical power connection. In particular embodiments, the mating array and the power connector have substantially fixed positions with respect to each other such that the power connector moves with the mating array. In other embodiments, the mating array and the power connector can move independently with respect to each other. For example, connector assemblies may move the mating array and the power connector simultaneously in different directions and/or at different times in the same or different directions.

As used herein, the term "mating array" includes a plurality of terminals arranged in a predetermined configuration. The terminals may be held together by a common structure or base material. By way of example, the mating array may be a contact array having a plurality of mating contacts configured to establish an electrical connection. The mating array may also be an optical terminal array having optical terminals configured to establish an optical connection. In some embodiments, the mating array may include both mating contacts and optical terminals.

The mating contacts of a contact array may be held together by a common base material or structure, such as a board substrate that includes a dielectric material. For example, a contact array may include or be a component of a printed circuit. A variety of mating contacts may be used in the contact arrays, including mating contacts that are stamped and formed, etched and formed, solder ball contacts, contact pads, press-fit contacts, and the like. In some embodiments, the mating contacts form a planar array (i.e., the mating contacts are arranged substantially co-planar with respect to each other and face a common direction). In other embodiments, the contact array may have multiple sub-arrays of mating contacts. Optical terminal arrays may have similar configurations and features as described with respect to the contact arrays.

As used herein, the term "printed circuit," includes any electric circuit in which the conducting connections have been printed or otherwise deposited in predetermined patterns on an insulating base or substrate. For example, a printed circuit may be a circuit board, an interposer made with printed circuit board (PCB) material, a flexible circuit having embedded conductors, a substrate having one or more layers of flexible circuit therealong, and the like. The printed circuit may have mating contacts arranged thereon.

A "flex connection," as used herein, includes flexible pathways that are capable of transmitting electric current and/or optical signals. The flex connection may permit movement of one of the components, such as contact array and/or power connector. A flex connection may include at least one of an electrical conductor and a fiber optic communication line and may be used to interconnect different mating arrays and/or power contacts. For example, a flex connection may be a flexible circuit configured to convey a current through conductors (e.g., conductive traces) embedded within a flexible substrate. Such a flexible circuit may transmit data and/or power between first and second components, which may include printed circuits and/or contact arrays. Furthermore, a flex connection may include one or more fiber optic communication lines (e.g., fiber optic cables) having optical waveguides that transmit light, for example, by total internal reflection. The optical waveguides may include a flexible cladding. The fiber optic cables may be configured to have a limited bend radius so that optical waveguides may transmit light through total internal reflection. In addition, a flex connection may include electrical conductors (e.g., wires) that are configured to transmit power therethrough. The electrical conductors may have predetermined dimensions (e.g., a predetermined gauge) that are suitable for transmitting a desired amount of electrical power. A "flexible circuit" (also called flex circuit), as used herein, is a printed circuit having an arrangement of conductors embedded within or between flexible insulating material(s). For example, flexible circuit(s) may be configured to convey an electric current between first and second electrical components, such as printed circuits or, more specifically, circuit boards and mating arrays.

An "interposer," as used herein, includes a planar body having opposite sides with corresponding mating contacts and a plurality of conductive pathways extending therebetween to connect the mating contacts. An interposer may be a circuit board where mating contacts are etched and formed along two opposing sides of the circuit board. The circuit board may have conductive pathways coupling each mating contact to a corresponding mating contact on the other side. However, in other embodiments, the interposer might not be a circuit board or another printed circuit. For example, an interposer may include a carrier having a planar body with a plurality of holes extending therethrough. Stamped and formed mating contacts may be arranged by the carrier such that each mating contact is positioned within a corresponding hole. The mating contacts may interface with one circuit board on one side of the carrier and have ball contacts that are soldered to another circuit board on the other side of the carrier. An interposer may also take other forms.

As used herein, an "alignment feature" includes alignment projections, apertures, and edges, or frames that may cooperate with each other in aligning the terminals. When a mating array and/or a power connector are moved toward a communication component and approach the communication component in a misaligned manner, alignment features of the communication component and the connector assembly may redirect the mating array and power connector. In particular embodiments, a power contact may also function as an alignment feature. For example, the power contact may project a distance toward the communication component and be shaped to cooperate with an aperture to align the terminals. Moreover, in some embodiments, the power contact may be received by the aperture that has, for example, a conductive band therein that electrically engages the power contact.

As used herein, "removably coupled" means that two coupled parts or components may be readily separated from and coupled (electrically, optically, or mechanically) to each other without destroying or damaging either of the two. By way of example, a removable card assembly may be removably coupled to an electrical system such that the removable card assembly may be repeatedly inserted and removed from an electrical system. The two coupled parts or components may be communicatively coupled. As used herein, when two components are "communicatively" coupled or connected, the two components can transmit electric current (e.g., for data signals or power) or light (e.g., optical data signals) therebetween.

Figure 1:
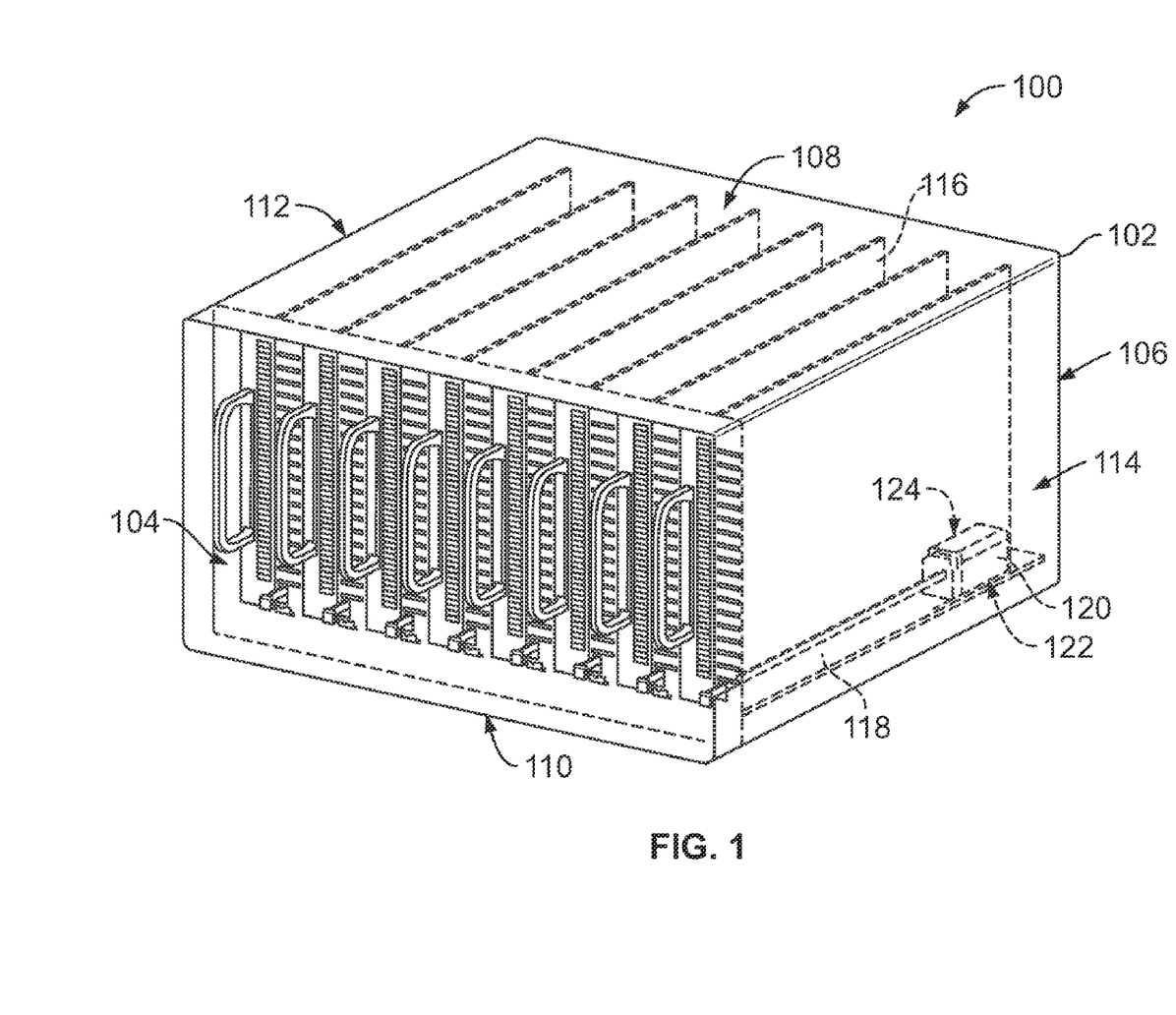
FIG. 1 is a perspective view of an electrical system formed in accordance with one embodiment.

FIG. 1 is a perspective view of an electrical system 100 formed in accordance with one embodiment. While the description provided herein focuses on an electrical system that may be a server system, the embodiments described herein may be used in one or more other types of systems, such as rack-mount server systems, other non-server based systems, other connector systems that mate with circuit boards, and connector systems that mate with connectors other than circuit boards. The electrical system 100 includes a housing 102 that has opposite front and back faces 104 and 106, opposite top and bottom faces 108 and 110, and opposite side faces 112 and 114. The housing 102 may have a substantially rectangular shape. Alternatively, the housing 102 may have other geometric shapes as desired.

Several removable circuit boards 116 may be loaded into and removed from the housing 102 through the front face 104. In the illustrated embodiment, the removable circuit boards 116 are blade server boards or daughter cards held in a parallel relationship with respect to one another within the housing 102. The removable circuit boards 116 are capable of being loaded into and removed from the housing 102 multiple times without damaging or otherwise destroying the electrical system 100 or the removable circuit boards 116. Each of the removable circuit boards 116 may be a printed circuit (e.g., PCB) having one or more electronic components (not shown) mounted thereon. The electronic components may include, by way of example only, hard drives, power supplies, network connectors, input/output devices and connectors, integrated circuits and processors, and the like. The removable circuit boards 116 may include terminals 124 disposed on or at one or more of opposite surfaces of the removable circuit boards 116.

The electrical system 100 may also include a motherboard 118 that is disposed within the housing 102. For example, the motherboard 118 may be located in the housing 102 in a position that is approximately parallel to the bottom face 110 and that is closer to the bottom face 110 than the top face 108. In the illustrated embodiment, the motherboard 118 is disposed in a non-parallel relationship with respect to the removable circuit boards 116. For example, the motherboard 118 may be approximately perpendicular with respect to the removable circuit boards 116. The motherboard 118 may include terminals 122 disposed on an upper surface of the motherboard 118.

The electrical system 100 may also include one or more connector assemblies 120. As shown, the connector assembly 120 may be mounted to the motherboard 118 and configured to removably couple with a corresponding removable circuit board 116. For example, the connector assembly 120 may include terminals (not shown) that removably couple with the terminals 122 of the motherboard 118 to electrically couple the connector assembly 120 with the motherboard 118.

In one embodiment, a single connector assembly 120 may be mounted to the motherboard 118 for each of the removable circuit boards 116 that is mated to the motherboard 118. For example, each connector assembly 120 may mate with a single removable circuit board 116. Alternatively, several connector assemblies 120 may be mounted to the motherboard 118 for each of the removable circuit boards 116. For example, two or more connector assemblies 120 may removably couple to a removable circuit board 116. In another embodiment, a single connector assembly 120 may be mounted to the motherboard 118 for two or more of the removable circuit boards 116. For example, a single connector assembly 120 may mate with two or more removable circuit boards 116. A combination of the connector assemblies 120 may be disposed within the housing 102. Alternatively, the connector assemblies 120 may be mounted to the removable circuit boards 116 to mate with the motherboard 118.

Data signals and/or electric power may be communicated between the removable circuit boards 116 and the motherboard 118 via one or more of the connector assemblies 120. Furthermore, the housing 102 may permit air to flow through the housing 102 from the front face 104 to the back face 106, and vice-versa. The connector assemblies 120 may be mounted to the motherboard 118 to avoid significantly restricting the airflow through the housing 102. As shown in FIG. 1, the connector assemblies 120 comprise a relatively low height profile above the motherboard 118. For example, the connector assemblies 120 do not significantly project from the motherboard 118 such that airflow across the surface of the motherboard 118 is significantly impeded.

Figure 2:
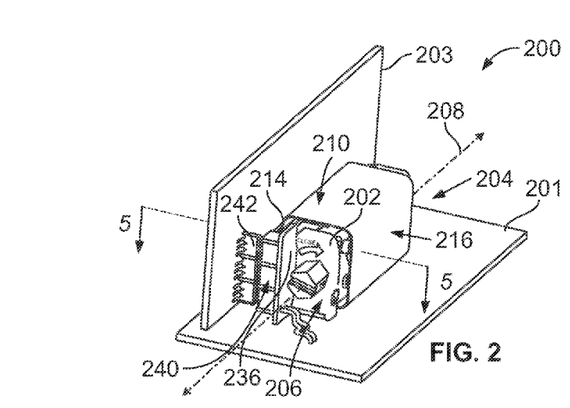
FIG. 2 is a perspective view of a connector assembly formed in accordance with one embodiment.

FIG. 2 is a perspective view of a connector assembly 200 formed in accordance with one embodiment. The connector assembly 200 may be similar to the connector assembly 120 (FIG. 1). For example, the connector assembly 200 may be mounted to a motherboard 201 and engage a corresponding removable circuit board 203. As shown, the connector assembly 200 includes an elongated body or base frame 202 that extends along a central longitudinal axis 208 between opposite frame ends 204 and 206. The connector assembly 200 includes a top side 210 disposed opposite to a mounting side (not shown). The mounting side is configured to be mounted to an electrical component, such as the motherboard 201. The connector assembly 200 also includes a moveable front or mating side 214 that is oriented opposite of a back or non-mating side 216. Also shown in FIG. 2, the mating side 214 may be coupled to a peripheral extension 236 having a power connector 240 attached thereto. The power connector 240 is configured to electrically engage a power contact 242 of the removable circuit board 203.

Figure 3:
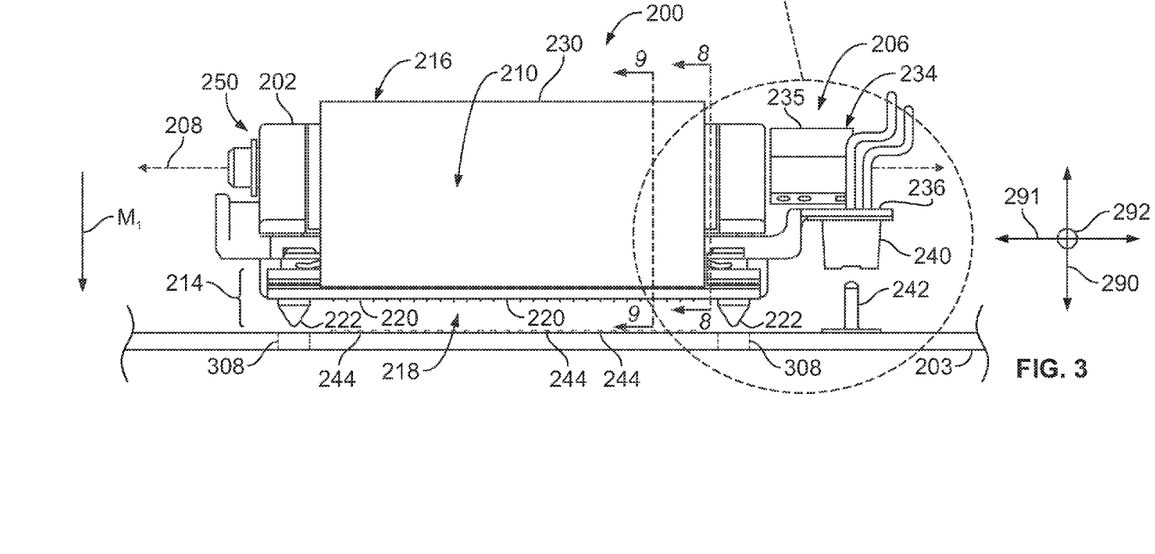
FIG. 3 is a top plan view of the connector assembly of FIG. 2.

FIG. 3 is a top plan view of the connector assembly 200. The mating side 214 includes a moveable mating array 218 that is configured to be selectively moved to and from the removable circuit board 203. The mating array 218 includes a plurality of terminals 220 disposed thereon that are configured to engage plurality of terminals 244 of the removable circuit board 203. In the illustrated embodiment, the terminals 220 are mating contacts configured to establish an electrical connection with corresponding terminals 244 of the removable circuit board 203. However, in other embodiments, the terminals 220 may be optical terminals configured to establish an optical connection.

The mating side 214 may be configured to be selectively moved between retracted and engaged positions with respect to the removable circuit board 203. As shown in FIG. 3, the mating array 218 and the power connector 240 are spaced apart from the removable circuit board 203 in the retracted position. The connector assembly 200 may include a coupling mechanism 250 that comprises one or more cams 412 (shown in FIG. 5) and an operator-controlled actuator 234 that is operatively coupled to the cams 412. The coupling mechanism 250 is configured to be actuated by an operator to move the mating side 214. The operator may be an individual or machine. In the illustrated embodiment, the actuator 234 is configured to be rotated about the longitudinal axis 208 to provide a driving force that moves the mating side 214 between the retracted and engaged positions. In alternative embodiments, the actuator 234 may be slidable along the longitudinal axis 208 and interact with other mechanical components of the connector assembly 200 to move the mating side 214 between the retracted and engaged positions. Furthermore, the connector assembly 200 may include a self-alignment subassembly 420 (shown in FIG. 5) that provides a floating force for aligning the terminals 220 of the mating array 218 with the terminals 244 of the removable circuit board 203. The self-alignment subassembly 420 may also provide a loading force that facilitates coupling the terminals 220 with the terminals 244.

Also shown, the mating side 214 may include forwardly projecting alignment features 222. In the illustrated embodiment, the alignment features 222 are shown as alignment projections or pins. However, in alternative embodiments, the alignment feature may be, for example, an aperture that engages a pin or projection of the removable circuit board 203. The alignment feature may also be an edge or frame. As shown, the alignment features 222 are received by alignment features 308 (also called alignment apertures or openings) in the removable circuit board 203. The alignment features 222 are received in the alignment openings 308 to spatially align the terminals 220 of the mating array 218 with the terminals 244 of the removable circuit board 203. For example, the mating array 218 moves away from the base frame 202 in a mating direction $M_1$ along a mating axis 290. The alignment features 222 are received by the alignment openings 308. If the alignment features 222 are received in a misaligned manner, the alignment features 222 and the alignment openings 308 may cooperate with each other to align the terminals 220 with the terminals 244. Accordingly, the mating array 218 may float, or move, relative to the base frame 202 in floating directions along lateral axes 291 and 292 to align the terminals 220 and 244. (The lateral axis 292 extends into and out of the page as shown in FIG. 3.) The mating direction $M_1$ and the lateral directions along the lateral axes 291 and 292 are bi-directional and oriented perpendicular to one another.

Although not shown, the mounting side of the connector assembly 200 may also include terminals that are electrically and/or optically coupled with the motherboard 201 (FIG. 2) when the connector assembly 200 is mounted thereto. The terminals on the mounting side are communicatively coupled with the terminals 220 on the mating array 218 via a flex connection 230. For example, the flex connection 230 may be a flexible circuit that extends from the mating side 214, across the top side 210 and the non-mating side 216 to the mounting side. The flex connection 230 may include communication lines, such as conductive traces, or optical fibers that communicatively couple the terminals 220 with the terminals on the mounting side. In alternative embodiments, the flex connection 230 may be wires, coaxial cables, or optical fibers that form communication lines for electrically and/or optically coupling the terminals 220 with the terminals on the mounting side.

The coupling mechanism 250 is held by the base frame 202. The actuator 234 may be movably supported by the base frame 202 so that the actuator 234 is rotatable and/or slidable with respect to the base frame 202. In the illustrated embodiment, the actuator 234 includes an engagement end 235 that projects from the frame end 206 and is configured to be engaged by an operator. In the illustrated embodiment, the actuator 234 may be rotated about the longitudinal axis 208 to move the mating array 218 away from the base frame 202 to the engaged positioned and rotated in an opposite direction to move the mating array 218 toward the base frame 202 to the retracted position. In alternative embodiments, the actuator 234 may be slidable along the longitudinal axis 208. In such cases, the coupling mechanism 250 may have other designs that use suitable components for providing the sliding actuation.

Figure 4:
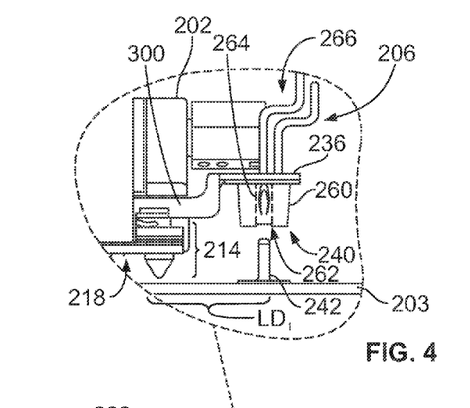
FIG. 4 is an enlarged detail view of a frame end of the connector assembly shown in FIG. 3.

FIG. 4 is an enlarged view of the frame end 206. In some embodiments, the power connector 240 has a substantially fixed position with respect to the mating array 218. The peripheral extension 236 may project in a direction along the longitudinal axis 208 (FIG. 3). The power connector 240 may be laterally spaced apart from the mating array 218 by a longitudinal distance $LD_1$. The longitudinal distance $LD_1$ may be configured so that the power connector 240 does not interfere or negatively affect the mating array 218. For example, the longitudinal distance $LD_1$ may be configured for improved airflow for heat dissipation. Also shown, the peripheral extension 236 may jog in a predetermined manner to accommodate for dimensions of the power connector 240.

The connector assembly 200 (FIG. 3) includes an intermediate or header portion 300 that is supported by the base frame 202. The peripheral extension 236 may be coupled to the header portion 300. For example, the peripheral extension 236 may be formed from the header portion 300 or attached to header portion 300. In alternative embodiments, the peripheral extension 236 may be coupled to a base panel 265 (shown in FIG. 5) of the mating side 214. Similarly, the peripheral extension 236 may be formed from the base panel 265 or attached to the base panel 265.

Also, in some embodiments, the peripheral extension 236 may have a fixed position relative to the mating side 214 or, more specifically, the mating array 218 such that the peripheral extension 236 moves with the mating side 214 or mating array 218. Although not shown, the peripheral extension 236 may be directly fixed to the mating side 214 or mating array 218. Such fixed (i.e., non-floating) embodiments may be suitable when the plurality of terminals 244 (FIG. 3) and the power contact 242 (FIG. 3) of the removable circuit board 203 have fixed positions relative to each other. However, in other embodiments, the peripheral extension 236 may float relative to the mating array 218. Such embodiments may be suitable when the plurality of terminals 244 and the power contact 242 of the removable circuit board 203 have fixed positions relative to each other.

In the illustrated embodiment, the power connector 240 includes a connector housing 260 having a housing cavity 262 and a power contact 264 located therein. (Both the housing cavity 262 and the power contact 264 are indicated by dashed lines.) The power contact 264 is configured to receive and electrically engage the power contact 242 of the removable circuit board 203 when the power connector 240 is moved to the engaged position. Also shown, the power connector 240 is electrically coupled to a flex connection 266. The flex connection 266 permits movement of the power connector 240 while maintaining the electrical connection. In the illustrated embodiment, the flex connection 266 may be conductive wires having predetermined gauges that are suitable for transmitting a desired electric current.

In some embodiments, the flex connection 266 may include a conductive material that is sized to reduce resistance of the flow of electric current. By reducing the resistance, heat dissipation from the flex connection 266 may also be reduced. Although the flex connection 266 is illustrated as wires in FIG. 4, other types of flex connections may be used in alternative embodiments. For example, the flex connection 266 may include a flat ribbon or braided wires. Furthermore, in alternative embodiments, the power connector 240 may be electrically coupled to a flexible circuit. The flexible circuit may be the same flexible circuit that connects to the mating array 218 or may be a different flexible circuit.

Furthermore, in particular embodiments, the mating array 218 and the power connector 240 are communicatively coupled to different types of flex connections. For example, the flex connection 266 may be a first flex connection that is configured to transmit electrical current to supply power and, therefore, may comprise certain materials and have dimensions suitable for transmitting power. Likewise, the flex connection 230 may be a different second flex connection that is configured to transmit data signals and, therefore, may comprise certain materials and have dimensions suitable for transmitting data signals.

In alternative embodiments, the power connector 240 comprises only a power contact that is electrically coupled to the flex connection 266. For example, the power contact may be a post or projection that extends toward the removable circuit board 203. In such embodiments, the removable circuit board 203 may include a power connector similar to the power connector 240 that has a connector housing with a power contact disposed therein.

Figure 5:
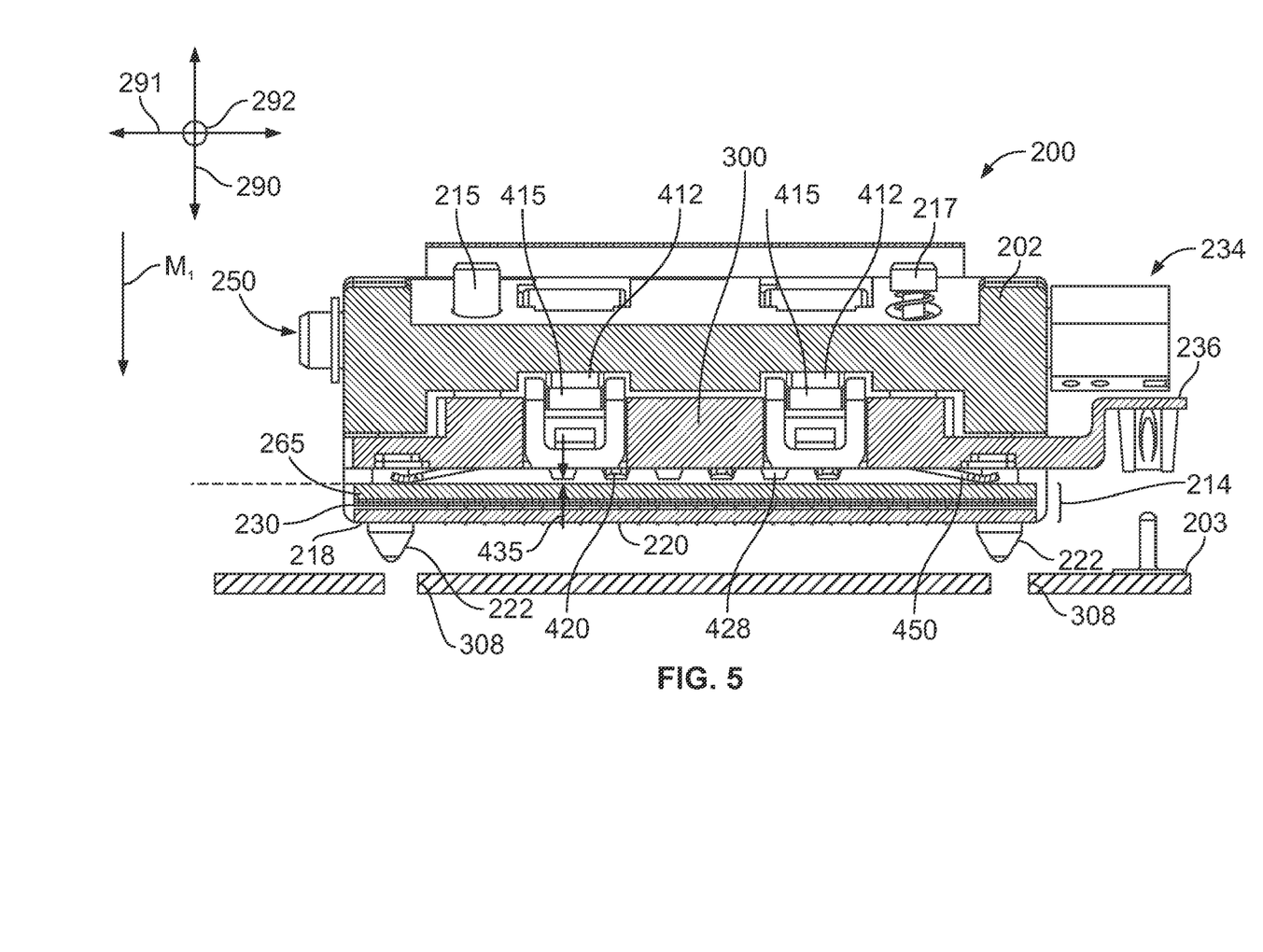
FIG. 5 is a cross-sectional view of the connector assembly taken along the lines 5-5 shown in FIG. 2.

FIG. 5 is a top-down cross-sectional view of the connector assembly 200 when the mating array 218 is in a retracted position with respect to the removable circuit board 203. As shown, the mating side 214 includes the mating array 218, the base panel 265, and a portion of the flex connection 230. The portion of the flex connection 230 is secured between the base panel 265 and the mating array 218. In the illustrated embodiment, the mating array 218 is an interposer having mating contacts on both sides. On one side the mating contacts engage the flex connection 230 and, on the other side, the mating contacts form the terminals 220. Although not shown, the mating contacts on either side may comprise resilient beams that project away from a corresponding surface of the mating array 218 and are configured to flex to and from the corresponding surface. In alternative embodiments, the mating array 218 may take other forms. For example, the mating array may be a circuit board having contact pads deposited thereon.

Also shown in FIG. 5, the connector assembly 200 includes the header portion 300 that is supported by the base frame 202 and located between the base frame 202 and the mating side 214. In the illustrated embodiment, the peripheral extension 236 is formed from the header portion 300. The header portion 300 functions as an intermediate element for operatively coupling the coupling mechanism 250 to the mating side 214. The coupling mechanism 250 includes the actuator 234 and the cams 412 coupled thereto. The cams 412 are configured to move the header portion 300 by engaging a corresponding bearing or roll bar 415 coupled to the header portion 300. The header portion 300 may also include guide members 215 and biasing members 217 that facilitate holding header portion 300 and mating side 214 (or mating array 218) in the retracted position when the cams 412 are not rotated to move the mating side 214 into the engaged position. The guide members 215 may be, for example, a rod or shaft that extends through the base frame 202 and couples to the header portion 300. The guide members 215 may control locating or orienting the header portion 300 with respect to the base frame 202. The biasing members 217 may include coil springs that provide a force that pulls the header portion 300 and mating side 214 toward the base frame 202.

Also shown, the connector assembly 200 includes a self-alignment sub-assembly 420 that is located between the header portion 300 and the mating side 214. The header portion 300 is configured to be moved in the mating direction $M_1$ toward the removable circuit board 203 by the actuator 234 when the actuator 234 is moved (e.g., rotated). The self-alignment subassembly 420 may be coupled to the header portion 300 and provide floating and loading forces for coupling the mating array 218 to the removable circuit board 203.

Figure 6:
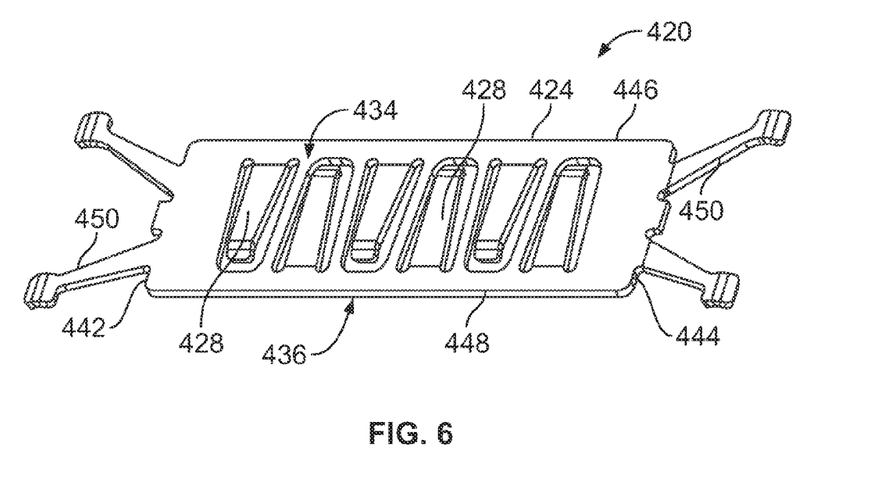
FIG. 6 is perspective view of a self-alignment subassembly that may be used with the connector assembly shown in FIG. 2.
Figure 7:
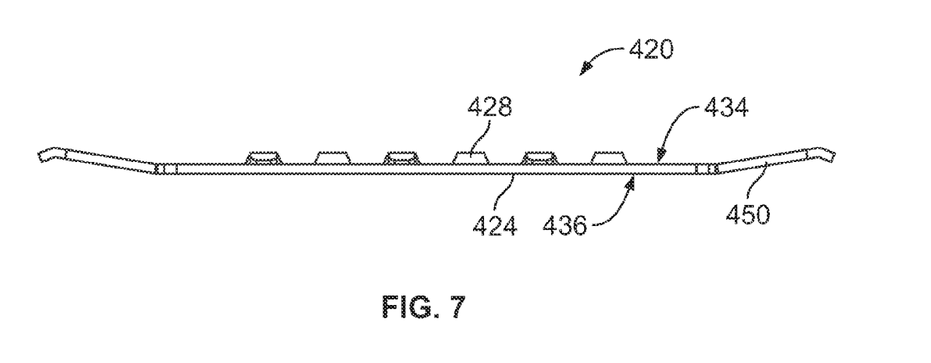
FIG. 7 is a side view of the self-alignment subassembly shown in FIG. 6.

FIGS. 6 and 7 are a perspective view and a side view, respectively, of the self-alignment subassembly 420. The self-alignment subassembly 420 is illustrated as a spring plate that has a generally planar body 424 that extends between opposite sides 434 and 436. As shown in FIG. 6, the sides 434 and 436 are interconnected by opposite edges 442 and 444 and opposite edges 446 and 448. As shown in FIGS. 6 and 7, the body 424 includes internal loading resilient members 428 that project from the side 434. Alternatively, the loading resilient members 428 may project from both sides 434 and 436 of the body 424. The body 424 also includes external floating resilient members 450 that project from the edges 442 and 444. The loading and floating resilient members 428 and 450 may be cantilevered beams. In one embodiment, the floating resilient members 450 may protrude further from the side 434 of the body 424 in a direction that is perpendicular to the side 434 than the loading resilient members 428. In the illustrated embodiment, the self-alignment subassembly 420 has a unitary body. For example, the self-alignment subassembly 420 may be stamped and formed from a common sheet of material, such as a metal sheet. However, in other embodiments, the self-alignment subassembly 420 may be separately formed from multiple components that are later combined, such as a series of coil springs or other resilient material.

Returning to FIG. 5, the floating resilient members 450 are configured to engage the base panel 265 and permit the mating array 218 to float or move relative to the base frame 202 in directions along the lateral axes 291 and 292 in order to align the terminals 220 of the mating array 218 with the terminals 244 (shown in FIG. 3) of the removable circuit board 203. When the alignment features 222 engage the alignment openings 308 in a misaligned manner, the mating array 218 may slide along floating resilient members 450 to self-align with respect to the removable circuit board 203. As shown, when the mating array 218 is in the retracted position, a gap 435 may exist between the loading resilient members 428 and the base panel 265. In alternative embodiments, the loading resilient members 428 may abut the base panel 265 such that no gap 435 exists.

Figure 8:
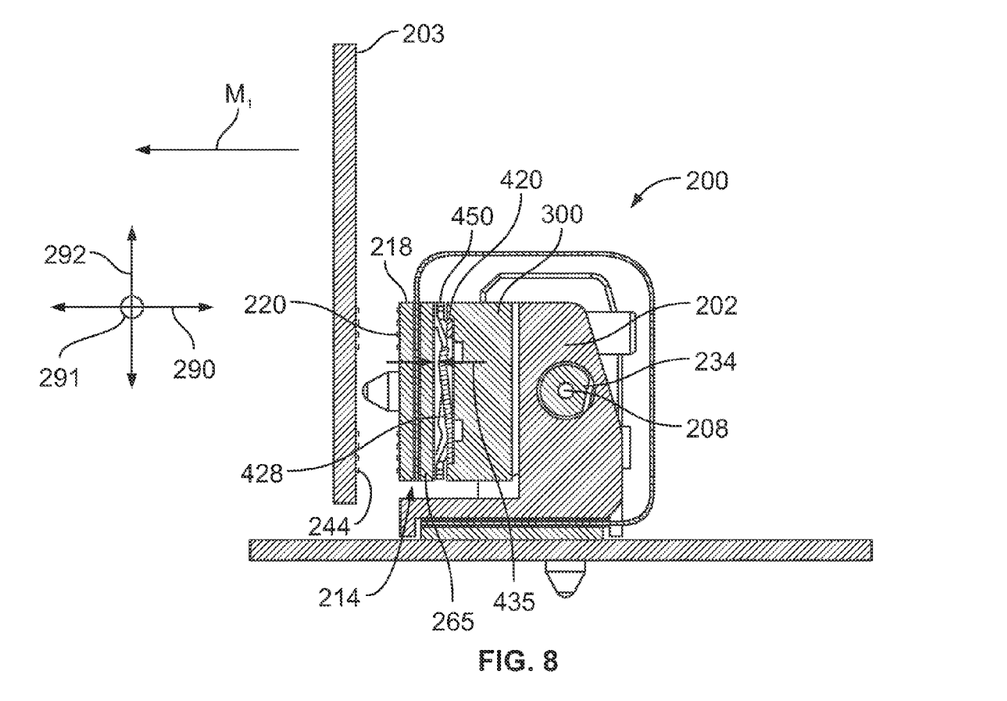
FIG. 8 is a cross-sectional view of the connector assembly taken along the lines 8-8 shown in FIG. 3.
Figure 9:
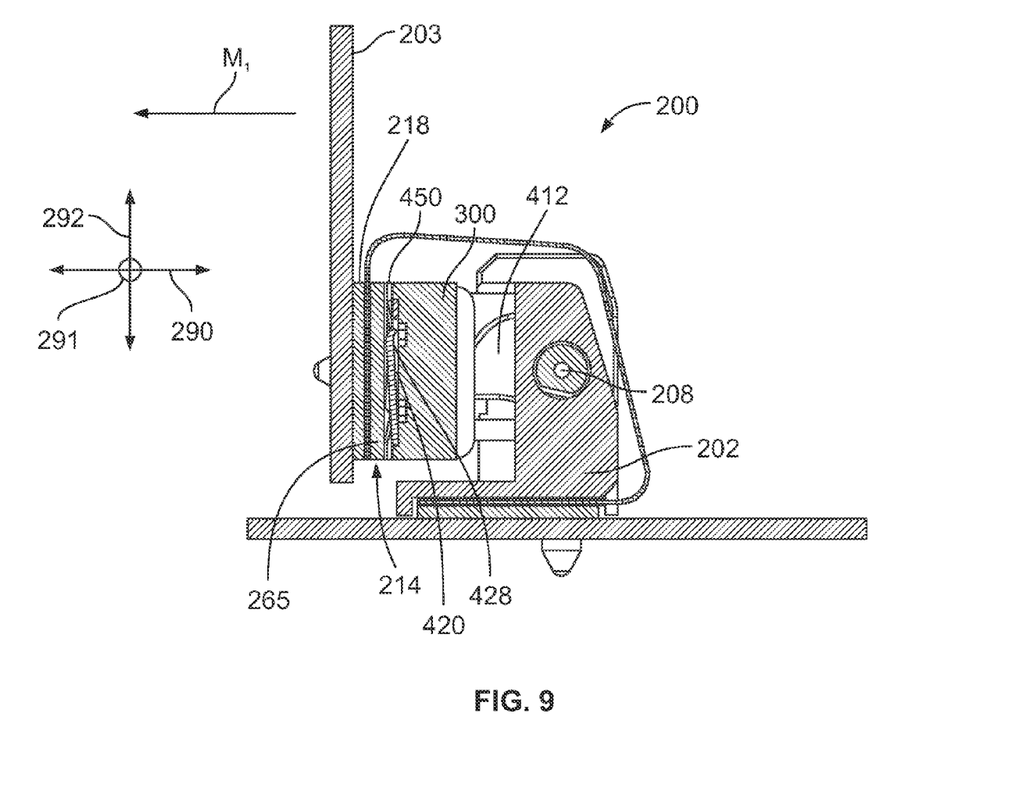
FIG. 9 is a cross-sectional view of the connector assembly taken along the lines 9-9 shown in FIG. 3.

FIGS. 8 and 9 are cross-sectional views of the connector assembly 200 taken along the lines 8-8 and 9-9, respectively, in FIG. 3. FIGS. 8 and 9 show the mating side 214 and the mating array 218 in the retracted and engaged positions, respectively. In the illustrated embodiment, the coupling mechanism 250 (FIG. 3) is configured to selectively move the mating side 214 in a linear manner between the engaged and retracted positions. To move the mating side 214 to the engaged position shown in FIG. 9, the actuator 234 is rotated about the longitudinal axis 208 in a clockwise manner. Accordingly, cams 412 (shown in FIG. 9) are rotated toward the header portion 300 and engage the corresponding roll bar 415 (FIG. 5) thereby driving the header portion 300 toward the removable circuit board 203. When the mating array 218 engages the removable circuit board 203, the floating and loading resilient members 450 and 428 of the self-alignment subassembly 420 may then be compressed between the base panel 265 and the header portion 300. The compressed floating and loading resilient members 450 and 428 provide separate forces in the mating direction $M_1$. To return the mating side 214 to the retracted position, the actuator 234 may be rotated in an opposite direction (e.g., counter-clockwise). Accordingly, the coupling mechanism 250 may be actuated to selectively move the mating array 218 between retracted and engaged positions. The coupling mechanism 250 may hold the mating array 218 in the retracted or engaged positions after actuation.

The self-alignment subassembly 420 may permit the mating side 214 to float (i.e., move in one or more of the directions along the axes 290-292 or slightly rotate about the axes 290-292) relative to the base frame 202 (or removable circuit board 203) when the mating array 218 is not properly aligned with the terminals 244 (FIG. 8) of the removable circuit board 203. The floating resilient members 450 of the self-alignment subassembly 420 engage the mating side 214 and permit the mating side 214 to float or move in at least one direction that is perpendicular to the mating direction $M_1$. As the header portion 300 continues to move in the mating direction $M_1$, the resilient members 450 continue to be compressed until the loading resilient members 428 also engage the base panel 265. Continued movement of the header portion 300 in the mating direction $M_1$ toward the removable circuit board 203 causes the loading resilient members 428 to be compressed between the header portion 300 and the base panel 265. Compression of the loading resilient members 428 causes the loading resilient members 428 to impart a loading force on the mating array 218 in the mating direction $M_1$. The loading force facilitates mating the terminals 220 on the mating array 218 with the terminals 244 of the removable circuit board 203.

Figure 10:
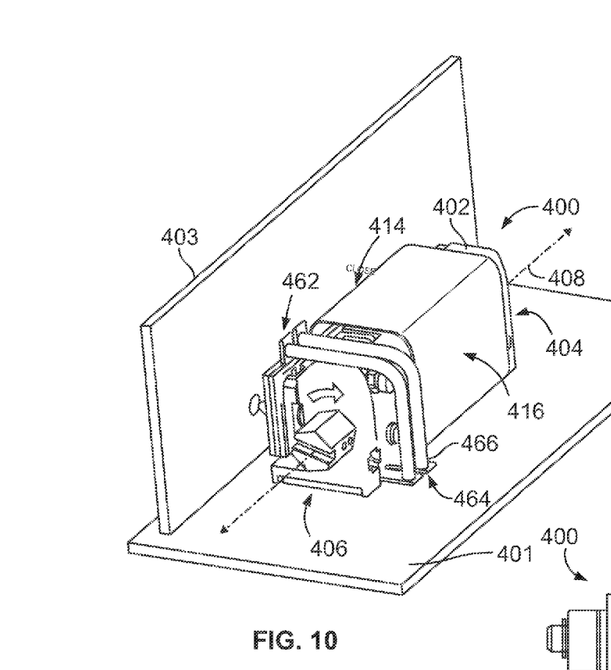
FIG. 10 is a perspective view of a connector assembly formed in accordance with an alternative embodiment.
Figure 11:
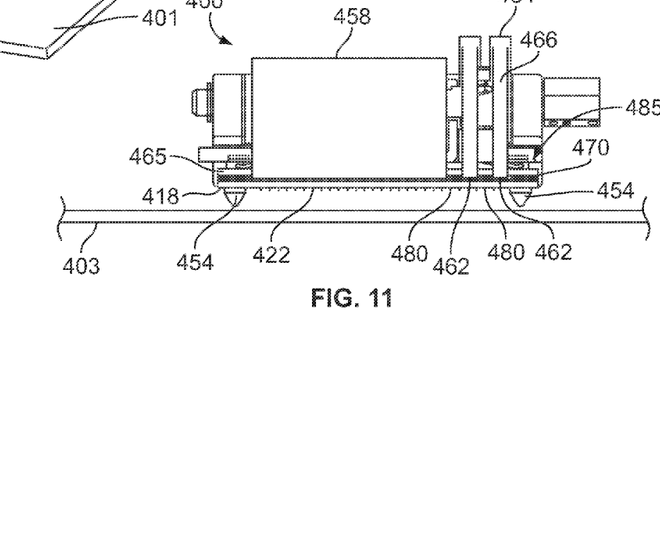
FIG. 11 is a top plan view of the connector assembly shown in FIG. 10.
Figure 12:
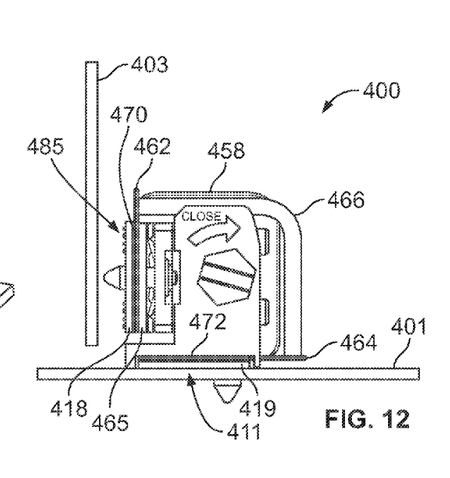
FIG. 12 is an end view of the connector assembly shown in FIG. 10.

FIGS. 10-12 illustrate a connector assembly 400 formed in accordance with an alternative embodiment. The connector assembly 400 may include similar features and elements as the connector assembly 200 (FIG. 2). For example, as shown in FIG. 10, the connector assembly 400 may be mounted to a motherboard 401 and be configured to engage a corresponding removable circuit board 403. As shown, the connector assembly 400 includes an elongated body or base frame 402 that extends along a central longitudinal axis 408 between opposite frame ends 404 and 406. The connector assembly 400 includes a moveable front or mating side 414 that is oriented opposite of a back or non-mating side 416. The mating side 414 may be moved by a coupling mechanism (not enumerated) that includes similar elements and functions in a similar manner as the coupling mechanism 250 (FIG. 3). The mating side 414 may include a plurality of tab extensions 462 that project from the mating side 414 and a plurality of tab extensions 464 that project from a mounting side 411 (shown in FIG. 12). The tab extensions 462 and 464 are communicatively coupled to each other via one or more flex connections 466. The flex connections 466 are shown as conductive wires in FIG. 10, but may also be other types of flex connections, such as those described above.

FIG. 11 is a top plan view of the connector assembly 400, and FIG. 12 is an end view of the connector assembly 400. As shown, the tab extensions 462 may be coupled to (e.g., formed from or attached to) a board substrate 470 that is located between a mating array 418 and a base panel 465. The board substrate 470 may be a portion of a flexible circuit 458 that communicatively couples the mating array 418 to the motherboard 401 (FIG. 12). Alternatively, the board substrate 470 may be separate from the flexible circuit 458. As shown in FIG. 11, the tab extensions 462 may be electrically coupled to power contacts 480 that are located on or proximate to the mating array 418. In some embodiments, the power contacts 480 may be the same as or similar to terminals 422 of the mating array 418. However, the power contacts 480 are configured to transmit electrical power whereas the terminals 422 are configured to transmit data signals. The power contacts 480 are configured to electrically engage corresponding electrical contacts (not shown) on the removable circuit board 403 when the mating array 418 is moved to an engaged position.

As shown in FIG. 12, the tab extensions 464 may also be coupled to a board substrate 472 that is mounted onto the motherboard 401 at the mounting side 411. More specifically, the board substrate 472 may interface with a mating array 419 that is communicatively coupled to the motherboard 401. In particular embodiments, when the connector assembly 400 is assembled, the flexible circuit 458 includes the board substrates 470 and 472 and also the tab extensions 462 and 464. To assemble the connector assembly 400, the flexible circuit 458 is secured between the mating array 418 and the base panel 465 at one end of the flexible circuit 458, and the flexible circuit 458 is secured to the mating array 419 at another end that is mounted to the motherboard 401. The flex connections 466 may be communicatively coupled to the tab extensions 462 and 464.

Electric current may flow between the power contacts 480 and power contacts (not shown) that engage the motherboard 401 through corresponding flex connections 466. Accordingly, the power contacts 480 and the tab extensions 462 and 464 may comprise a power connector 485 of the connector assembly 400. As shown, the power connector 485 is coupled to the mating side 414 (FIG. 10) and may be held in a substantially fixed position with respect to the mating array 418. The mating array 418 and the power connector 485 are spaced apart from the removable circuit board 403 in the retracted position (as shown in FIGS. 10-12) and communicatively coupled to the removable circuit board 403 in the engaged position. When the mating side 414 is moved, the flexible circuit 458 and flex connections 466 move with the mating side 414.

In alternative embodiments, instead of electric current flowing through the power contacts 480, the electric current may flow through alignment features 454 that electrically engage the removable circuit board 403. In such embodiments, the alignment features 454 may comprise the power contacts of the power connector 485.

Figure 13:
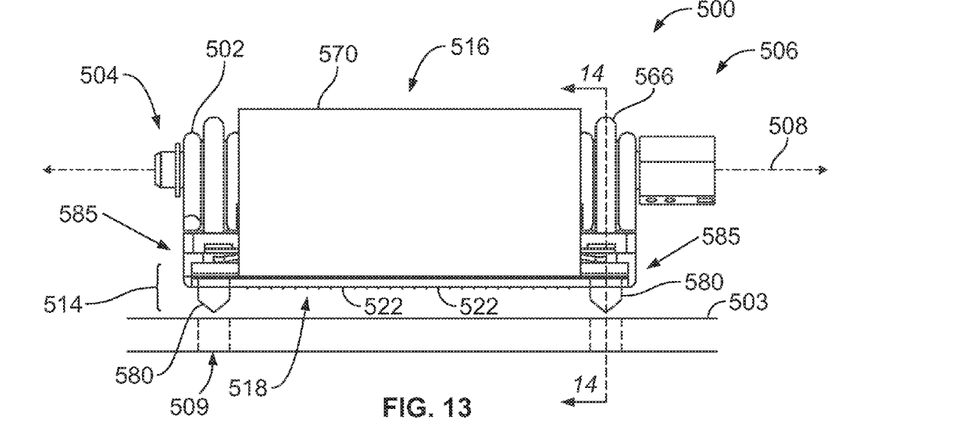
FIG. 13 is a top plan view of a connector assembly formed in accordance with an alternative embodiment.
Figure 14:
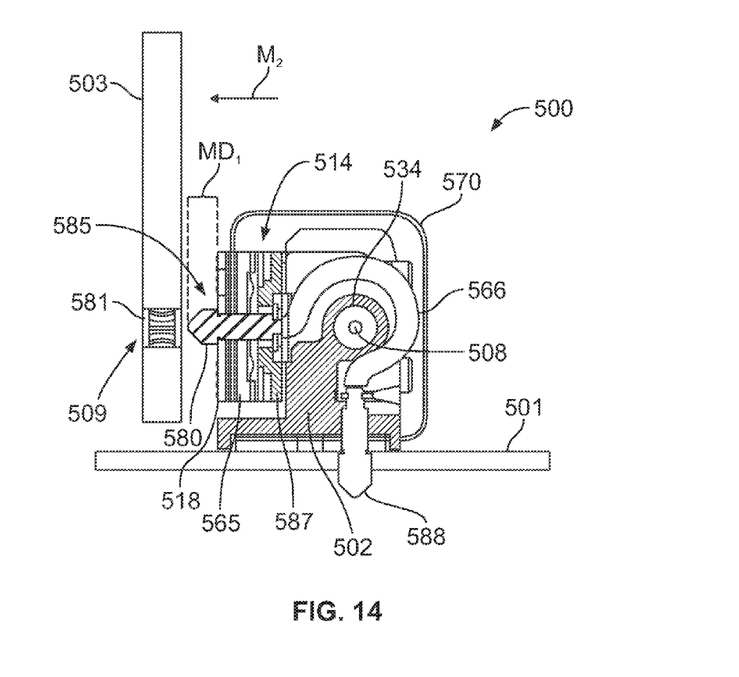
FIG. 14 is a cross-sectional view of the connector assembly taken along the lines 14-14 in FIG. 13.

FIGS. 13-14 illustrate a connector assembly 500 formed in accordance with an alternative embodiment. The connector assembly 500 may include similar features and elements as the connector assemblies 200 (FIG. 2) and 400 (FIG. 10). For example, as shown in FIG. 13, the connector assembly 500 may be configured to engage a corresponding removable circuit board 503. The connector assembly 500 includes an elongated body or base frame 502 that extends along a central longitudinal axis 508 between opposite frame ends 504 and 506. The connector assembly 500 includes a moveable front or mating side 514 that is oriented opposite of a back or non-mating side 516. The mating side 514 includes a mating array 518 having a plurality of terminals 522 thereon configured to engage corresponding terminals (not shown) on the removable circuit board 503. The connector assembly 500 may also include a flex connection 570 that is communicatively coupled to the mating array 518 and configured to transmit data signals and/or power therethrough. The mating side 514 may be moved by a coupling mechanism (not enumerated) that includes similar elements and functions in a similar manner as the coupling mechanism 250 (FIG. 3).

As shown in FIGS. 13 and 14, the mating side 514 may include a pair of power connectors 585 in which each comprises a power contact 580 that is secured to and extends through the mating side 514. The power contact 580 may also function as an alignment feature of the mating side 514. The power contact 580 is configured to electrically engage a spring contact 581 (FIG. 14) that is located within an alignment opening 509 (FIG. 14) of the removable circuit board 503. Accordingly, the power contact 580 may serve a dual-purpose by cooperating with the alignment opening 509 to align the mating array 518 and also to establish an electrical connection between the removable circuit board 503 and a motherboard 501 (FIG. 14).

As shown in FIG. 14, the power contact 580 projects a mating distance $MD_1$ beyond the mating array 518 in a mating direction $R_2$. The power contact 580 also extends through the mating array 518, the base panel 565, and a header portion 587. The power contact 580 is secured to the header portion 587 and electrically coupled to a flex connection 566. The flex connection 566 is illustrated as a conductive wire, but may be other types of flex connections. As shown in FIG. 14, the flex connection 566 is also electrically coupled to a power contact 588 that is engaged with the motherboard 501. The flex connection 566 may extend around the longitudinal axis 508 and an operator-controlled actuator 534 of the connector assembly 500. The base frame 502 may be shaped to permit the flex connection 566 to extend therethrough and also move therein when the mating side 514 is moved between the retracted and engaged positions.

Similar to the connector assemblies 200 and 400, the power connector 585 is coupled to the mating side 514 and may be held in a substantially fixed position with respect to the mating array 518. The mating array 518 and the power connector 585 are spaced apart from the removable circuit board 503 in the retracted position (as shown in FIGS. 13-14) and communicatively coupled to the removable circuit board 503 in the engaged position. When the mating side 514 is moved, the flex connections 566 move with the mating side 514.

Although not shown in the Figures, the power connectors 240, 485, and 585 or the connector assemblies 200, 400, and 500 may include a coupling sensor that indicates to the power connector that an electrical connection has been established. For example, when a closed circuit has been established for at least one signal line between a motherboard and a daughter card, a coupling sensor of the motherboard (or daughter card) could activate the power contact and permit electric current to flow therethrough. By way of example only, the coupling sensor may be a resilient beam that projects from a mating array. When the resilient beam is fully compressed against a surface of the mating array (thereby indicating that the mating array is mated with the removable circuit board), the coupling sensor may trigger a mechanism that allows the electric current to flow therethrough. For example, the resilient beam could be communicatively coupled to a chip in the motherboard that could switch or activate the power contact when the chip detects a closed circuit. Other coupling sensors may be used as well. By using such coupling sensors, individuals or other components of the electrical systems may not be inadvertently shocked.

Figure 15:
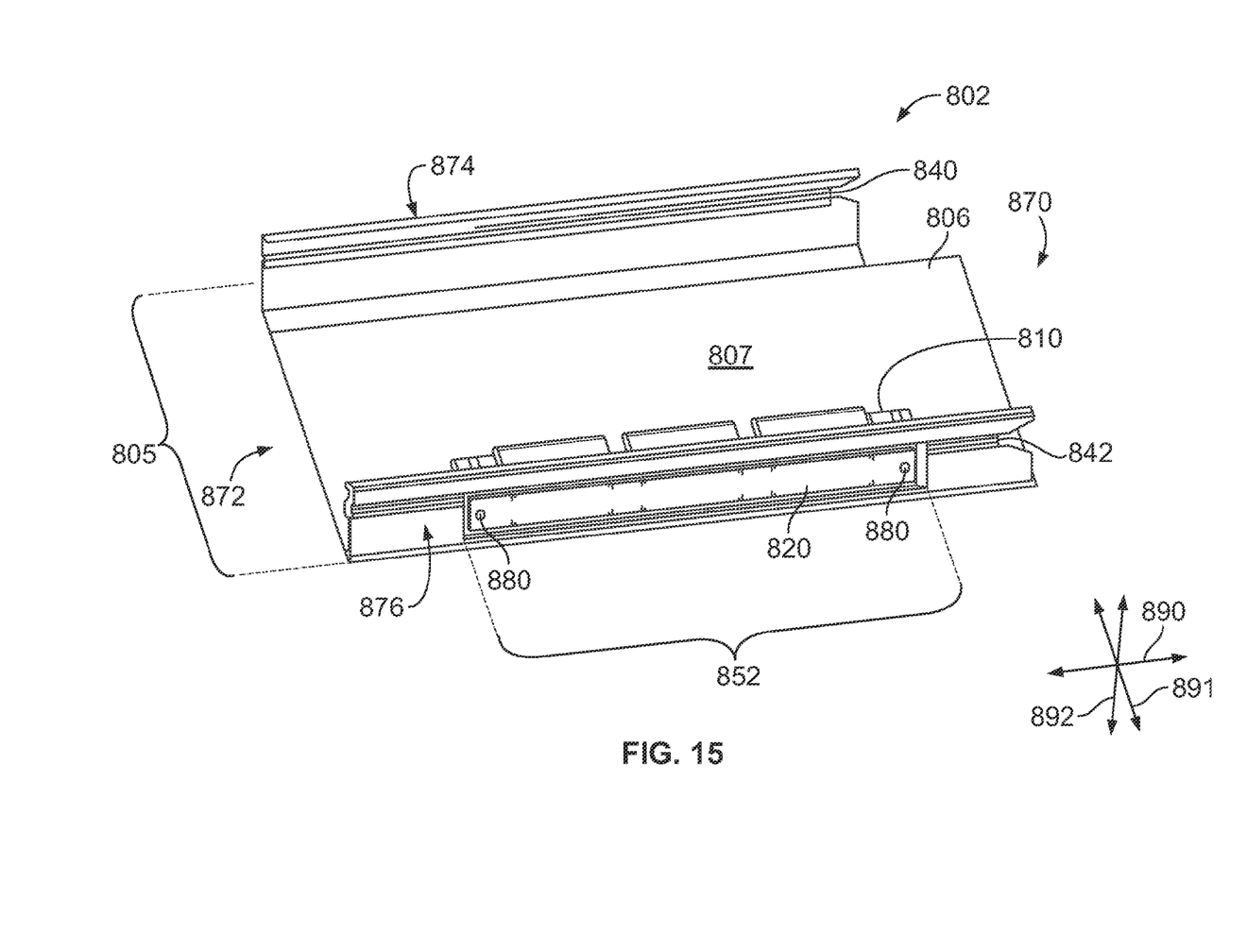
FIG. 15 is a bottom perspective view of a removable card assembly formed in accordance with another embodiment.

FIG. 15 is a bottom perspective view of a removable card assembly 802 formed in accordance with another embodiment. As shown, the removable card assembly 802 has a leading end 870 and a trailing end 872. The removable card assembly 802 is oriented with respect a longitudinal axis 890 and lateral axes 891-892. The removable card assembly 802 includes a card assembly frame 805 that comprises a pair of opposing sidewalls 874 and 876 that extend from the leading end 870 to the trailing end 872. At least one of the sidewalls 874 and 876 may be configured to interface with an electrical system (not shown) when the removable card assembly 802 is inserted therein. The card assembly frame 805 may also include a circuit board 806 having a surface 807. A connector assembly 810 may be coupled or mounted to the surface 807. The connector assembly 810 may be similar to the connector assemblies 200, 400, and 500 described above. The sidewalls 874 and 876 may project away from the surface 807 in a perpendicular manner. The card assembly frame 805 may also have an additional sidewall (not shown) that extends parallel to the circuit board 806 so that the connector assembly 810 is held therebetween. Accordingly, the card assembly frame 805 may shield the connector assembly 810 therein and protect the connector assembly 810 during insertion into and removal from an electrical system. In some embodiments, the additional sidewall that is not shown may be another circuit board that may have another connector assembly coupled thereto.

In the illustrated embodiment, the removable card assembly 802 is a server blade that is configured to be engaged or coupled to a motherboard of the electrical system. For example, the removable card assembly 802 may have guiding features 840 and 842 for engaging corresponding features or elements within the electrical system. In FIG. 15, the guiding features 840 and 842 are shown as guide channels that are sized and shaped to receive, e.g., guide pins or rails within the electrical system. Alternatively, the guiding features 840 and 842 may be guide pins or rails that engage guide channels within the electrical system.

When the removable card assembly 802 is inserted into the electrical system, the removable card assembly 802 and, more specifically, the connector assembly 810 has a fixed orientation with respect to a printed circuit (not shown) within the electrical system. Also shown, the sidewall 876 may have a wall opening 852 that is sized and shaped to allow a mating array 820 of the connector assembly 810 to move therethrough to engage the printed circuit. In alternative embodiments, the sidewall 876 may be integrally formed with, e.g., a base frame of the connector assembly 810. In the illustrated embodiment, the connector assembly 810 is similar to the connector assembly 500 (FIG. 13) and includes power contacts 880 that also function as alignment features. However, in alternative embodiments, other connector assemblies may be used such as those described above. When necessary, the wall opening 852 may be sized to permit a power connector to move therethrough. For example, the wall opening 852 may be sized to permit the peripheral extension 236 (FIG. 3) and power connector 240 (FIG. 3) to move therethrough.

Although the illustrated embodiments are described with reference to electrically interconnecting printed circuits and, more specifically, circuit boards, the description herein is not intended to be limited to printed circuits or circuit boards. Embodiments described herein may also be used to interconnect other electrical components where an electrical component has an array of mating contacts that complement or are configured to engage the mating contacts of a moveable contact array, such as other flexible circuits. Furthermore, although the illustrated embodiments are described with reference to electrical connections, embodiments described herein may be similarly configured to establish optical connections.

It is to be understood that the above description is intended to be illustrative, and not restrictive. As such, other connectors and coupling mechanisms may be made as described herein that couple a moveable mating array to another array of terminals. For example, the connector assemblies and coupling mechanisms may be like the connector assemblies and coupling mechanisms described in U.S. patent application Ser. Nos. 12/428,851; 12/428,806; 12/686,484; 12/686,518; 12/757,835; 12/646,314; and 12/685,398; all of which are incorporated by reference in their entirety. By way of one example, the coupling mechanism may include an operator-controlled actuator that is slidable along a longitudinal axis. The actuator may have ramps that engage roll bars or bearings within the connector assembly. When the ramps push the bearings outward, a mating side is also pushed in a mating direction toward the removable circuit board. Such a coupling mechanism is described in greater detail in U.S. patent application Ser. No. 12/685,398, which is incorporated by reference in the entirety. Furthermore, connector assemblies described herein may also be configured to move a plurality of mating arrays in different directions and/or at different times according to a predetermined sequence. Such connector assemblies are described in greater detail in U.S. patent application Ser. Nos. 12/686,484 and 12/686,518, which are incorporated by reference in their entirety.

In addition, the above-described embodiments (and/or aspects or features thereof) may be used in combination with each other. Furthermore, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly comprising:
   a base frame extending along a longitudinal axis between a pair of frame ends;
   a moveable mating side attached to the base frame and extending in a direction along the longitudinal axis, the mating side having a mating array of terminals configured to transmit data signals;
   a power connector coupled to the mating side and configured to establish an electrical connection with a power contact;
   a coupling mechanism supported by the base frame and being operatively coupled to the mating side, the coupling mechanism moving the mating array of terminals and the power connector between retracted and engaged positions relative to the base frame, the mating array of terminals and the power connector being spaced apart from a communication component in the retracted position and communicatively coupled to the communication component in the engaged position; and
   at least one flex connection coupled to the power connector to supply power and coupled to the mating array of terminals to transmit data signals, the at least one flex connection permitting the power connector and the mating array of terminals to move relative to the base frame.

2. The connector assembly in accordance with claim 1, wherein the power connector has a substantially fixed position with respect to the mating array of terminals such that the power connector moves with the mating array of terminals when the coupling mechanism moves the mating side.

3. The connector assembly in accordance with claim 1, wherein the power connector includes a power contact that projects a distance beyond the mating side in a direction toward the communication component.

4. The connector assembly in accordance with claim 1, wherein the power connector includes a connector housing having a housing cavity configured to receive an electrical contact from the communication component, the housing cavity receiving the electrical contact as the coupling mechanism moves the power connector relative to the base frame toward the communication component.

5. The connector assembly in accordance with claim 1 further comprising a peripheral extension coupled to and projecting away from the mating side, the peripheral extension having the power connector thereon, the power connector being spaced apart from the mating array of terminals by a longitudinal distance measured along the longitudinal axis, the peripheral extension moving relative to the base frame when the power connector is moved by the coupling mechanism.

6. The connector assembly in accordance with claim 1, wherein the mating side comprises a board substrate that extends along the longitudinal axis, the power connector including a power contact that is affixed to the board substrate.

7. The connector assembly in accordance with claim 1 further comprising an alignment feature having a fixed position with respect to the mating array of terminals, said alignment feature cooperating with another alignment feature of the communication component to align the mating array of terminals when moved into the engaged position, wherein the power connector includes a power contact that also functions as the alignment feature.

8. The connector assembly in accordance with claim 1, wherein the coupling mechanism drives the mating array of terminals in a mating direction toward the communication component to the engaged position, wherein the mating array of terminals is floatable in at least one direction that is perpendicular to the mating direction as the mating array of terminals is driven to the engaged position.

9. The connector assembly of claim 8, further comprising a self-alignment subassembly having resilient members that engage the mating side, the self-alignment subassembly permitting the mating array of terminals to float relative to the base frame and in the at least one direction perpendicular to the mating direction.

10. The connector assembly in accordance with claim 1, wherein the coupling mechanism comprises an operator-controlled actuator that is movably supported by the base frame and operatively coupled to the mating side.

11. The connector assembly in accordance with claim 10, wherein the actuator is rotatable about the longitudinal axis.

12. The connector assembly of claim 1, wherein the coupling mechanism holds the mating array of terminals in the engaged position or the retracted position and, when the coupling mechanism is actuated, drives the mating array of terminals to the other of the engaged position or the retracted position.

13. The connector assembly of claim 1, wherein the at least one flex connection is two separate flex connections.

14. A connector assembly comprising:
   a base frame extending along a longitudinal axis between a pair of frame ends;
   a moveable mating side supported by the base frame and extending in a direction along the longitudinal axis, the mating side having a mating array of terminals configured to transmit data signals;

a power connector coupled to the mating side and configured to establish an electrical connection with a power contact; and a coupling mechanism supported by the base frame and being operatively coupled to the mating side, the coupling mechanism configured to be actuated to move the mating side between retracted and engaged positions in a mating direction with respect to the longitudinal axis, the mating array of terminals and the power connector being spaced apart from a communication component in the retracted position and communicatively coupled to the communication component in the engaged position;

wherein the power connector is electrically coupled to a first flex connection that is configured to transmit electric current to supply power and the mating array of terminals is communicatively coupled to a different second flex connection that is configured to transmit the data signals.

15. The connector assembly of claim 14, wherein the first flex connection includes a conductive wire and the second flex connection includes a flexible circuit.

16. A removable card assembly comprising:

a card assembly frame having leading and trailing ends and a longitudinal axis extending therebetween, the card assembly frame configured to be removably coupled to an electrical system;

a moveable mating side attached to the card assembly frame and extending in a direction along the longitudinal axis, the mating side having a mating array of terminals configured to transmit data signals;

a power connector coupled to the mating side and configured to establish an electrical connection with a power contact;

a coupling mechanism supported by the card assembly frame and being operatively coupled to the mating side, the coupling mechanism moving the mating array of terminals and the power connector between retracted and engaged positions relative to base frame, the mating array of terminals and the power connector being spaced apart from a communication component in the retracted position and communicatively coupled to the communication component in the engaged position; and at least one flex connection coupled to the power connector to supply power and coupled to the mating array of terminals to transmit data signals, the at least one flex connection permitting the power connector and the mating array of terminals to move relative to the base frame.

17. The removable card assembly in accordance with claim 16, wherein the power connector has a substantially fixed position with respect to the mating array of terminals.

18. The removable card assembly in accordance with claim 16, wherein the at least one flex connection includes different first and second flex connections, the power connector being electrically coupled to the first flex connection, the first flex connection configured to transmit electric current to supply power, the mating array of terminals being communicatively coupled to the second flex connection, the second flex connection configured to transmit the data signals.

19. The removable card assembly in accordance with claim 16 further comprising an alignment feature having a fixed position with respect to the mating array of terminals, said alignment feature cooperating with another alignment feature of the communication component to align the mating array of terminals when moved into the engaged position, wherein the power connector includes a power contact that also functions as the alignment feature.

20. The removable card assembly in accordance with claim 16, wherein the card assembly frame comprises a sidewall that extends along the longitudinal axis and interfaces with the electrical system.

21. The removable card assembly in accordance with claim 20, wherein the sidewall includes a wall opening that extends along the longitudinal axis and is sized and shaped to allow the mating array of terminals to move therethrough.

22. The removable card assembly in accordance with claim 16, wherein the coupling mechanism drives the mating array of terminals in a mating direction toward the communication component to the engaged position, wherein the mating array of terminals and the power connector are floatable in at least one direction perpendicular to the mating direction as the mating array of terminals is driven to the engaged position.

* * * * *